(12) United States Patent
Schuele et al.

(10) Patent No.: US 7,235,437 B2
(45) Date of Patent: Jun. 26, 2007

(54) MULTI-PLANAR LAYOUT VERTICAL THIN-FILM TRANSISTOR INVERTER

(75) Inventors: Paul J. Schuele, Washougal, WA (US); Apostolos T. Voutsas, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 72 days.

(21) Appl. No.: 10/862,761

(22) Filed: Jun. 7, 2004

(65) Prior Publication Data
US 2005/0236671 A1 Oct. 27, 2005

Related U.S. Application Data

(63) Continuation-in-part of application No. 10/831,424, filed on Apr. 23, 2004, now Pat. No. 6,995,053.

(51) Int. Cl.
*H01L 21/84* (2006.01)
(52) U.S. Cl. .................. 438/154; 257/E21.411
(58) Field of Classification Search ........ 438/151–166; 257/E21.411
See application file for complete search history.

(56) References Cited

U.S. PATENT DOCUMENTS 5,047,360 A * 9/1991 Nicholas ..................... 438/158
5,340,759 A * 8/1994 Hsieh et al. ................. 438/156
6,649,980 B2 * 11/2003 Noguchi ...................... 257/351
6,753,239 B1 * 6/2004 Conn .......................... 438/459
6,974,981 B2 * 12/2005 Chidambarrao et al. ..... 257/265

OTHER PUBLICATIONS

A Novel Vertical Bottom-Gate Polysilicon Thin Film Transistor with Self-aligned Offset, Lai et al., IEEE Electron Device Letters, vol. 17, No. 5, May 1996, p. 199-201.
A Vertical Submicro Polysilicon Thin-Film Transistor Using a Low Temperature Process, Zhao et al., IEEE Electron Device Letters, vol. 15, No. 10, Oct. 1994, p. 415-417.

* cited by examiner

*Primary Examiner*—Richard A. Booth
(74) *Attorney, Agent, or Firm*—Law Office of Gerald Maliszewski; Gerald Maliszewski

(57) ABSTRACT

A vertical thin-film transistor (V-TFT) inverter circuit and a method for forming a multi-planar layout TFT inverter circuit have been provided. The method comprising: forming a P-channel TFT with a gate, a first source/drain (S/D) region in a first horizontal plane, and a second S/D region in a second horizontal plane, different than the first horizontal plane; and, forming an N-channel TFT, adjacent the P-channel TFT, with a gate, a third S/D region in a third horizontal plane, and a fourth S/D region in the second horizontal plane, different than the third horizontal plane. Forming a P-channel TFT includes forming a P-channel top-drain vertical TFT (TDV-TFT), and forming an N-channel TFT includes forming an N-channel TDV-TFT.

16 Claims, 9 Drawing Sheets

MULTI-PLANAR LAYOUT VERTICAL THIN-FILM TRANSISTOR INVERTER

RELATED APPLICATIONS

This application is a continuation-in-part of a patent application entitled, VERTICAL THIN FILM TRANSISTOR, invented by Schuele et al., Ser. No. 10/831,424, filed Apr. 23, 2004, now U.S. Pat. No. 6,995,053.

BACKGROUND OF THE INVENTION

1. Field of the Invention

This invention generally relates to integrated circuit (IC) and liquid crystal display (LCD) fabrication and, more particularly, to a CMOS inverter circuit enabled through the use of vertical TFTs (V-TFTs) configured in a multi-planar layout.

2. Description of the Related Art

The size of TFTs formed in liquid crystal display (LCD) processes are limited by the resolution of large panel photolithography tools. Currently, the resolution of feature sizes is about 0.5 microns (um) and larger. High-speed circuit operation requires a TFT capable of high drive current and low parasitic capacitance. These characteristics are obtained by shrinking the device size, especially the transistor channel length. For example, conventional production CMOS technology uses transistor channel lengths of 90 nanometers (nm), and lower, for very high-speed operation.

FIGS. 1A and 1B are a schematic drawing and a plan view, respectively, of a conventional inverter circuit (prior art). The most basic logic element is an inverter, consisting of an N and P channel transistor as shown in FIG. 1A. A common arrangement for fabrication of an inverter circuit uses planar transistors is shown in FIG. 1B. These transistors have a channel length (L) equal to 0.8 microns. Note that the width of the P channel device is larger than the N channel device because of the higher drive current of N channel transistors. In most cases the P/N width ratio is about 2.

The above-mentioned Related Application discloses a V-TFT with a very short channel length. It would be advantageous if the size of simple CMOS circuits, such as an inverter, could be made smaller using V-TFTs.

It would be advantageous if the size of an inverter circuit could be made smaller, with a more compact topology, by taking advantage of the non-planar features of the V-TFT.

SUMMARY OF THE INVENTION

The present invention is an inverter circuit made from Vertical Thin Film Transistors (V-TFTs). One unique aspect of the V-TFT is that the transistor channel width is defined by the shape of the gate electrode, as well as by the active layer. The structure has two separate transistors of width W, separated by a gate electrode. The channel width is determined by the width of the active layer, and length is defined by the thickness of the gate electrode. The process flow may result in a LDD implant at the top of the structure, so a high voltage terminal may be placed over the gate.

The above-mentioned V-TFT geometries make possible the formation of alternate geometry circuits. For example, an inverter circuit can be fabricated so that the drain of the P transistor and the source of the N transistor can be formed on different planes, and the gate channels can be formed orthogonal to the source/drain regions.

Accordingly, a method is provided for forming a multi-planar layout thin-film transistor (TFT) inverter circuit. The method comprises: forming a P-channel TFT with a gate, a first source/drain (S/D) region in a first horizontal plane, and a second S/D region in a second horizontal plane, different than the first horizontal plane; and, forming an N-channel TFT, adjacent the P-channel TFT, with a gate, a third S/D region in a third horizontal plane, and a fourth S/D region in the second horizontal plane, different than the third horizontal plane. Forming a P-channel TFT may include forming a P-channel top-drain vertical TFT (TDV-TFT), and forming an N-channel TFT includes forming an N-channel TDV-TFT.

More specifically, forming P and N-channel TDV-TFTs includes: forming a P-channel gate having sidewalls and a top surface; forming an N-channel gate having sidewalls and a top surface; forming a cap oxide layer overlying the P and N-channel gate top surfaces; forming a gate oxide layer overlying the P and N-channel gate sidewalls; forming the first S/D region overlying the P-channel cap oxide layer; forming the second S/D region overlying a substrate insulation layer, adjacent a P-channel gate first sidewall; forming a first channel region overlying the P-channel gate first sidewall, interposed between the first and second S/D regions; forming the third S/D region overlying the N-channel cap oxide layer; forming the fourth S/D region overlying the substrate insulation layer, adjacent an N-channel gate first sidewall, and connected to the second S/D region; and, forming a second channel region overlying the N-channel gate first sidewall, interposed between the third and fourth S/D regions.

Additional details of the above-described method and a multi-planar layout TFT inverter circuit are presented in more detail below.

DETAILED DESCRIPTION OF THE PREFERRED EMBODIMENTS

Figure 2A:
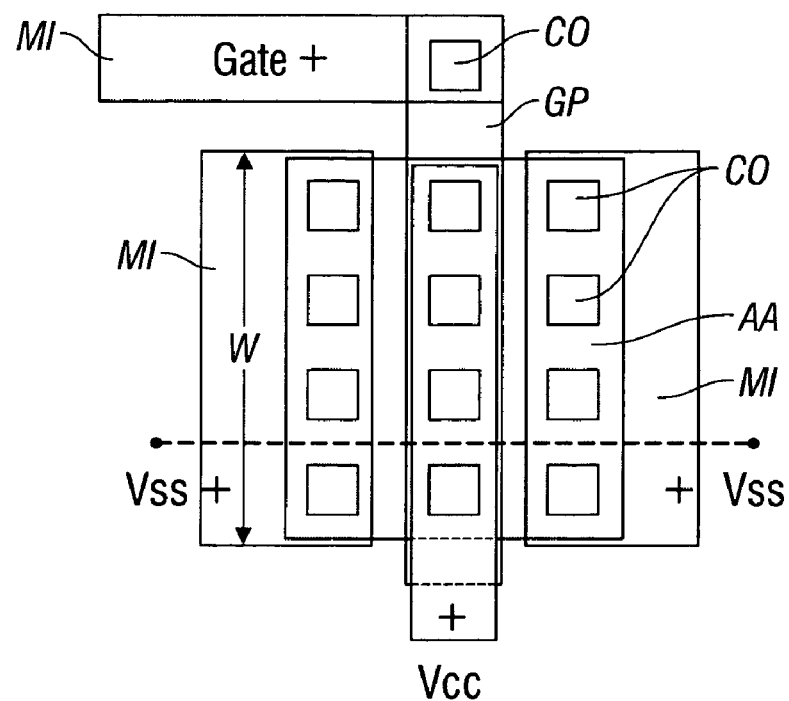
FIGS. 2A and 2B are plan and partial cross-sectional views, respectively, of a V-TFT.
Figure 2B:
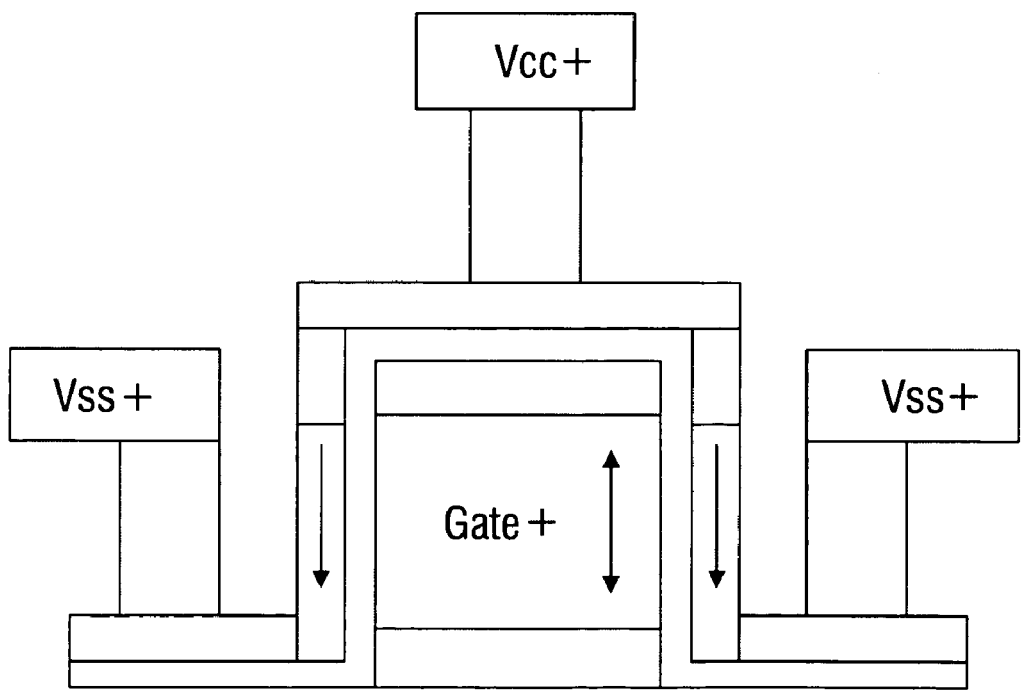

FIGS. 2A and 2B are plan and partial cross-sectional views, respectively, of a V-TFT. The present invention is an inverter circuit using an N and a P-channel V-TFT. One unique aspect of the V-TFT is that the transistor channel width is defined by the shape of the gate electrode, as well as by the active layer. In FIG. 2A it can be seen that the structure has two separate transistors of width W separated by the gate electrode. If the LDD implant is performed at the top of the structure, the high voltage (Vcc) terminal can be located over the gate, which is the center row of contacts in FIG. 2A. FIG. 2A shows two transistors with a common gate, and channel width determined by the width of the active layer (W), and length defined by the thickness of the gate electrode (L). These unique topologies permit the basic layout of logic elements, such as an inverter circuit, to be reconsidered. In FIG. 2B, current flow is marked by the arrows.

Figure 3A:
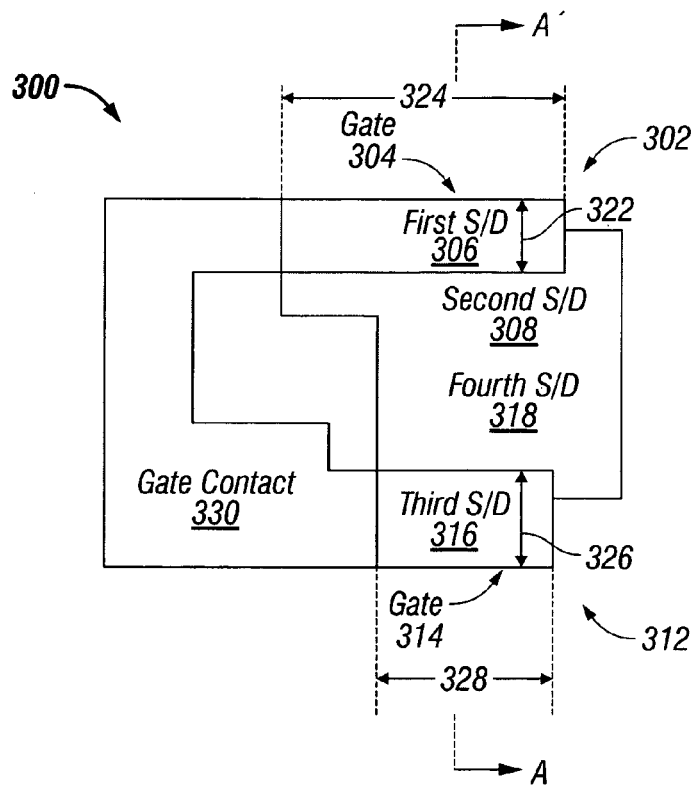
FIGS. 3A and 3B are a plan view and simplified cross-sectional view, respectively, of the present invention multi-planar layout TFT inverter circuit.
Figure 3B:
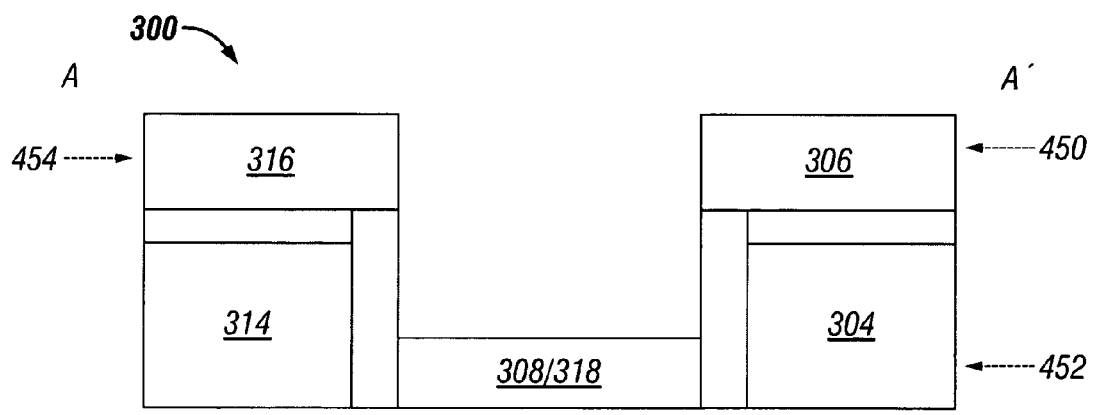

FIGS. 3A and 3B are a plan view and simplified cross-sectional view, respectively, of the present invention multi-planar layout TFT inverter circuit. The inverter 300 comprises a P-channel TFT 302 with a gate 304, a first source/drain (S/D) region 306 in a first horizontal plane 450, and a second S/D region 308 in a second horizontal plane 452, different than the first plane 450. As used herein, the words "vertical" and "horizontal" are intended to be a convenient reference to orient the viewer with the drawing. The inverter 300 also comprises an N-channel TFT 312, adjacent the P-channel TFT 302, with a gate 314, a third S/D region 316 in a third horizontal plane 454, and a fourth S/D region 318 in the second horizontal plane 452, different from the third plane 454. As shown, the planes are formed through the above-mentioned S/D regions. Alternately, the planes can be defined with respect to the S/D top or bottom surfaces. In some aspects, the first horizontal plane 450 is the same as the third horizontal plane 454.

The P-channel TFT gate 304 has a length 322, and a width 324 greater than the length 322. Likewise, the N-channel TFT gate 314 has a length 326, and a width 328 greater than the length 326. As is conventional, the N-channel TFT 312 and P-channel TFT 302 include a S/D region common to both the P-channel and N-channel TFTs. That is, S/D region 308 and 318 are directly connected, or can be considered to be the same electrode.

In one aspect, both the P-channel TFT 302 and N-channel TFT 312 are top-drain vertical TFTs (TDV-TFTs). That is, S/D region 306 and S/D region 316 are drains located over gates 304 and 314, respectively. In another aspect it can be said that the channel lengths are formed in a vertical plane.

Figure 4:
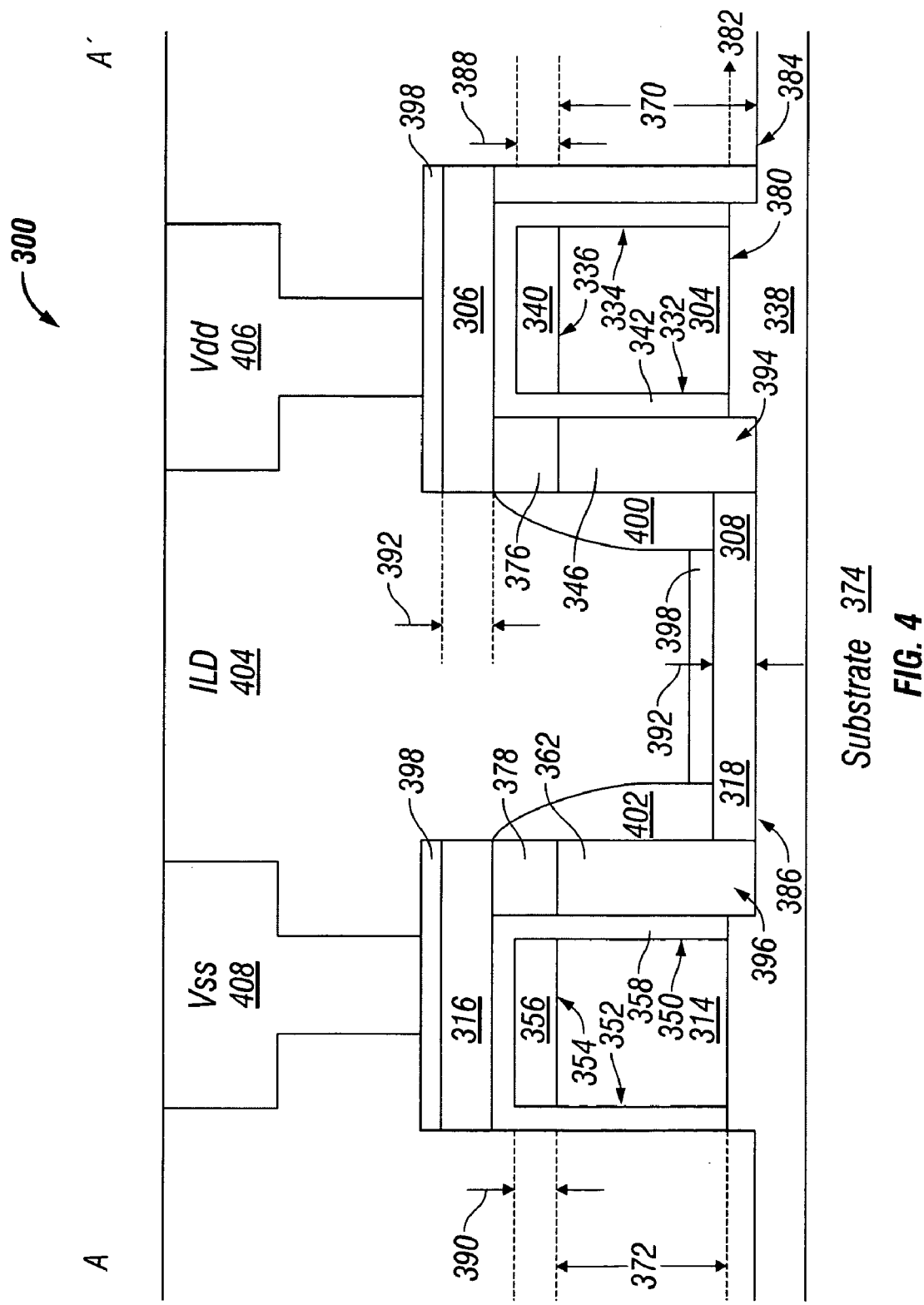
FIG. 4 is a partial cross-sectional detailed view of the present invention inverter of FIG. 3B.

FIG. 4 is a partial cross-sectional detailed view of the present invention inverter of FIG. 3B. Considering FIGS. 3A, 3B, and 4, the P-channel TDV-TFT 302 includes the P-channel gate 304 with a gate contact 330, sidewalls 332 and 334, and a top surface 336, overlying a substrate insulation layer 338. A cap oxide layer 340 overlies the P-channel gate top surface 336. A gate oxide layer 342 overlies the gate sidewalls 332/334. Note, the gate oxide layer 342 may also overlie the cap oxide layer 340 in some aspects. Typically, the gate oxide layer 342 is substantially thinner than the cap oxide thickness (390). The first S/D region 306 overlies the P-channel cap oxide layer 340. The second S/D region 308 overlies the substrate insulation layer 338, adjacent P-channel gate first sidewall 332. A first channel region 346 overlies the P-channel gate first sidewall 334, interposed between the first S/D region 306 and the second S/D region 308.

The N-channel TDV-TFT 312 includes the N-channel gate 314 with a gate contact 330, sidewalls 350 and 352, and a top surface 354, overlying the substrate insulation layer 338. A cap oxide layer 356 overlies the N-channel gate top surface 354. A gate oxide layer 358 overlies the gate sidewalls 350/352, respectively. The third S/D region 316 overlies the N-channel cap oxide layer 356. The fourth S/D region 318 overlies the substrate insulation layer 338, adjacent N-channel gate first sidewall 350, and connected to the second S/D region 308. A second channel region 362 overlies the N-channel gate first sidewall 350, interposed between the third S/D region 316 and the fourth S/D region 318.

In one aspect, the P-channel gate 304 has a first thickness 370 and the N-channel gate 314 has a second thickness 372. The first channel region 346 and second channel region 362 have channel lengths about equal to the first thickness 370 and second thickness 372, respectively. As shown, the first and second thicknesses 370/372 are shown as being equal. However, in other aspects of the invention they can be different, so that the first and second channels 346/362 have lengths that are different. Typically, the P and N-channel gate first and second thicknesses 370/372 are in the range of 1000 to 6000 Å.

Also shown is a substrate 374 made from a material such as Si, quartz, glass, or plastic. The substrate insulation layer 338 can be a material such as SiO2, SiO2/Si3N4/SiO2, or organic insulators such as polyimide.

In one aspect, lightly doped drains (LDDs) 376 and 378 are formed in the first and second channel regions 346/362, adjacent the first and third S/D regions 306/316, respectively. In another aspect, the substrate insulation layer 338 has a surface 380 along a fourth plane 382. Substrate insulation layer recesses 384 and 386 are formed in the substrate insulation layer 338, lower than (beneath) the fourth plane 382. The first and second channel regions 346/362 extend into the substrate insulation layer recesses 384/386, respectively.

The cap oxide layers 340/356 overlying the P and N-channel gate top surfaces 336/354, respectively, are made from a material such as SiO2 or Si3N4, and have thicknesses 388 and 390, respectively, in the range of 300 to 1500 Å. The first, second, third, and fourth S/D regions 306/308/316/318 may each have a thickness 392 in the range of 300 to 1000 Å.

In another aspect, Vt adjust implants 394 and 396 are formed in the first and second channel regions 346/362, respectively. In another aspect, a silicide metal 398, such as Ni, Ti, and Co, may be formed overlying the first, second, third, and fourth S/D regions 306/308/316/318. Further, oxide spacers 400 and 402 may be formed overlying the first and second channel regions 346/362, respectively.

As shown in FIG. 4, an interlevel dielectric (ILD) 404 overlies the P and N-channel TDV-TFTs 302/312, with a Vdd interconnect 406 through the ILD 404 to the first S/D region 306 and a Vss interconnect 408 through the ILD 404 to the third S/D region 316.

In summary, FIGS. 3A, 3B, and 4 depict the present invention CMOS inverter 300. The inverter 300 comprises a P-channel top-drain vertical TFT (TDV-TFT) 302 having a source drain (S/D) region 306 connected to a first voltage (Vdd), a second S/D region 308, and a gate 304. The N-channel TDV-TFT 312 has a third S/D region 316 connected to a second voltage (Vss), a fourth S/D region 318 connected to the second S/D region 308, and gate 314 connected to the P-Channel TDV-TFT gate 304.

FUNCTIONAL DESCRIPTION

Figure 1A:
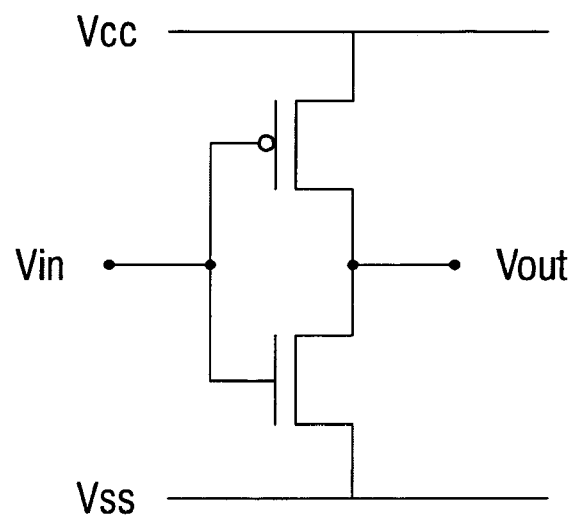
FIGS. 1A and 1B are a schematic drawing and a plan view, respectively, of a conventional inverter circuit (prior art).
Figure 1B:
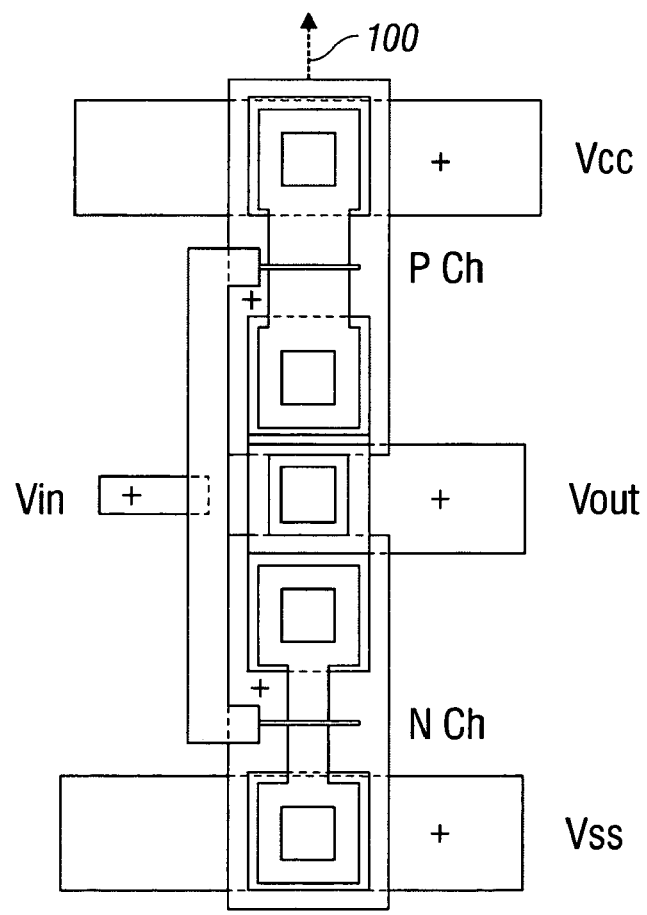
Figure 5:
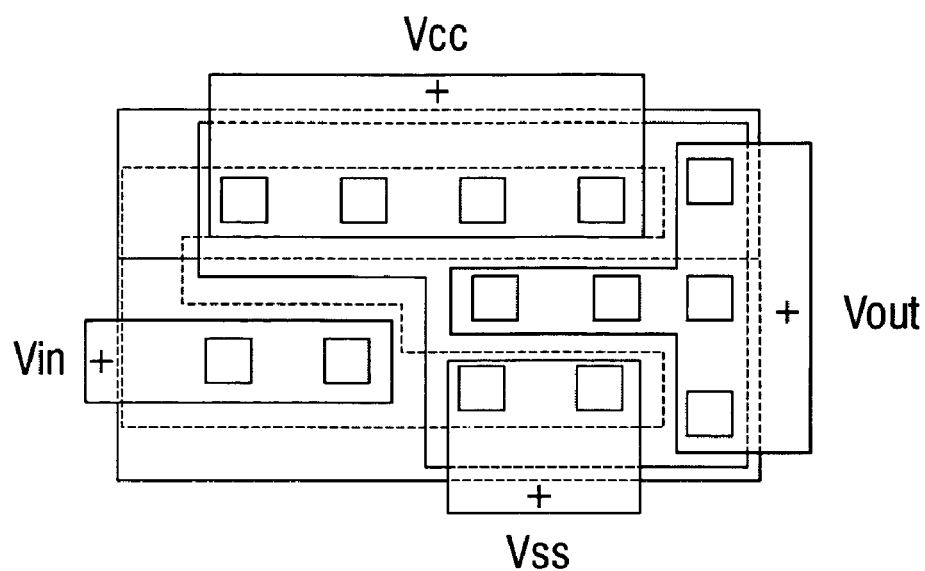
FIG. 5 is a plan view, general layout of the V-TFT inverter.

FIG. 5 is a plan view, general layout of the V-TFT inverter. The basic functionality of the present invention inverter is the same as the inverter shown in FIG. 1B. Vin controls the gate, Vcc is applied to the P-channel transistor, Vss is applied to the N-channel transistor, and the inverter output is the common source/drain area between the P and N-channel transistors. As in FIG. 1B, the width of the P-channel transistor is about twice that of the N-channel device.

Figure 6:
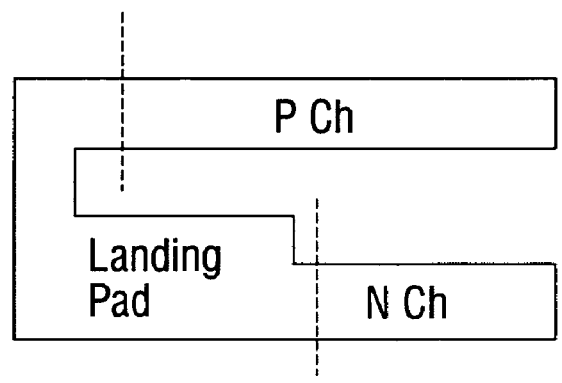
FIGS. 6 through 11 depict steps in the fabrication of the present invention inverter circuit.

FIGS. 6 through 11 depict steps in the fabrication of the present invention inverter circuit. A description of the V-TFT inverter fabrication follows. A polysilicon gate is patterned on an insulating substrate by photolithography and plasma etching as shown in FIG. 6. The gate structure has three regions: a P-channel transistor gate, an N-channel transistor gate, and a landing pad area for gate contact.

Figure 7:
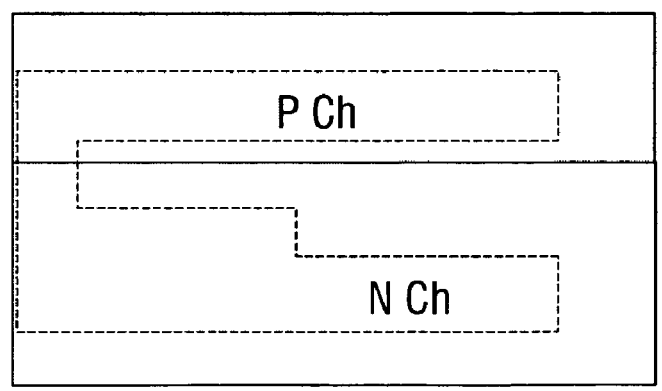

As shown in FIG. 7, the gate is doped using photolithography and ion implantation, to form N+ and P+ doped poly regions.

Figure 8:
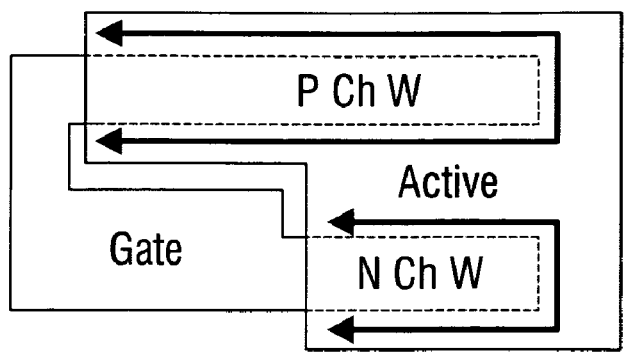

In FIG. 8, gate oxide and amorphous silicon layers are deposited over the gate and patterned using photolithography and plasma etching. It can be seen that the effective width of transistors is governed by the overlap between active and gate patterns. The N and P-channel transistor widths are shown by the arrows. The gate-active spacing should be large enough that the active width can conduct current to the output contacts.

Figure 9:
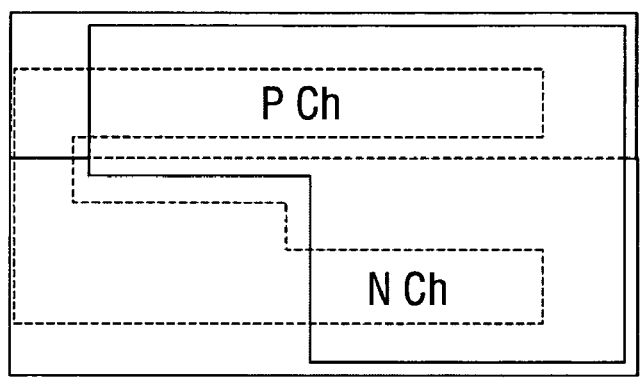

In FIG. 9 N+, P+, N-LDD, and P-LDD implants are carried out. Details of these processes are presented in the above-mentioned Related Application. A boundary between P and N regions is shown in the middle of the structure. A spacer is deposited to block silicide formation on the back of the active channel, to prevent shorting between gate and active areas. Metal silicide is formed on the gate landing pads and active source/drain regions.

Figure 10:
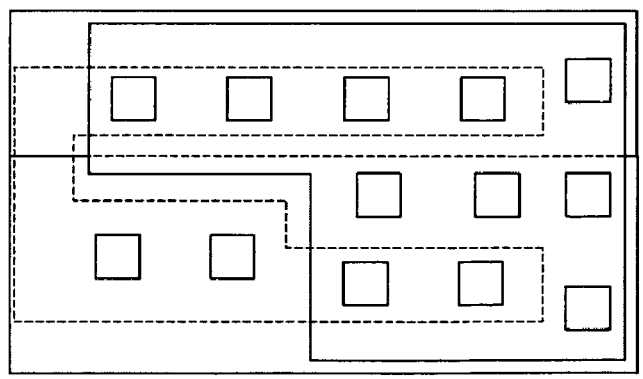

In FIG. 10 an insulating layer is deposited and contact openings are formed by photolithography and plasma etching.

FIG. 5 shows the completed structure with the first level of metal interconnects. After this point conventional fabrication methods are used to make connections between other inverter circuits, and to passivate the structure.

Figure 11:
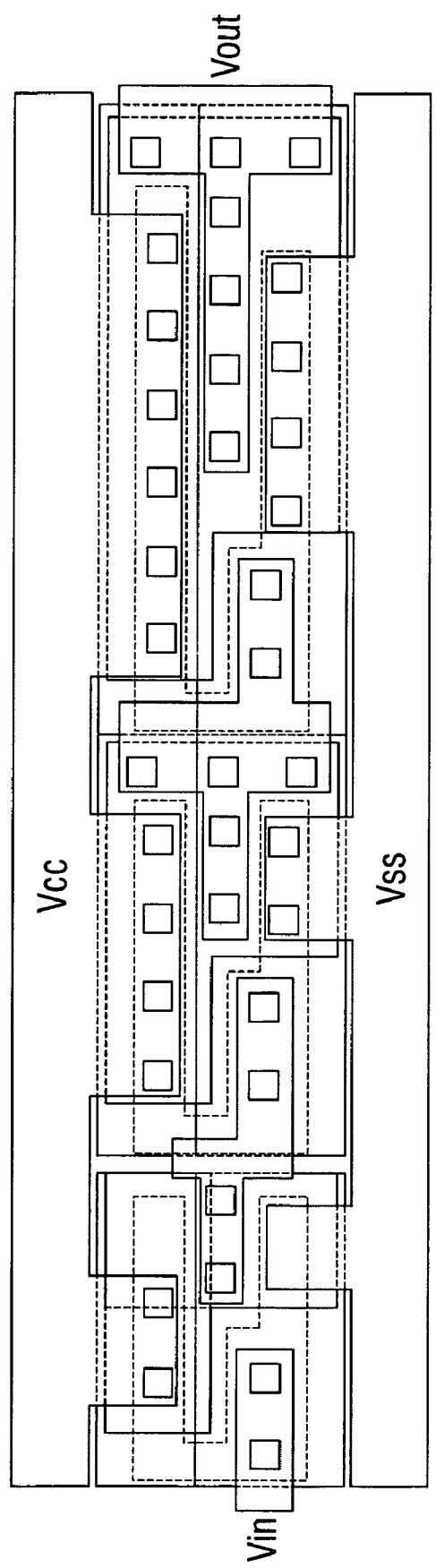

FIG. 11 depicts three inverter structures that are chained together, to produce a relatively efficient layout with little wasted space.

The present invention describes the application of V-TFTs as building blocks in the fabrication of practical circuits. The obvious advantage of V-TFTs is higher speed and better space utilization (as compared to conventional TFTs) without the necessity of deep-sub-µm lithography technology. These advantages translate into an opportunity for the integration of advanced features (circuits) on displays using existing fabrication technology and infrastructure. One additional benefit is that V-TFTs can be fabricated simultaneously with conventional transistors, as they share common CMOS processes. Thus, all the benefits and features of conventional TFTs can be combined with all the benefits and features of V-TFTs. V-TFT technology does not necessarily replace existing TFT technology but rather, complements it.

Figure 12A:
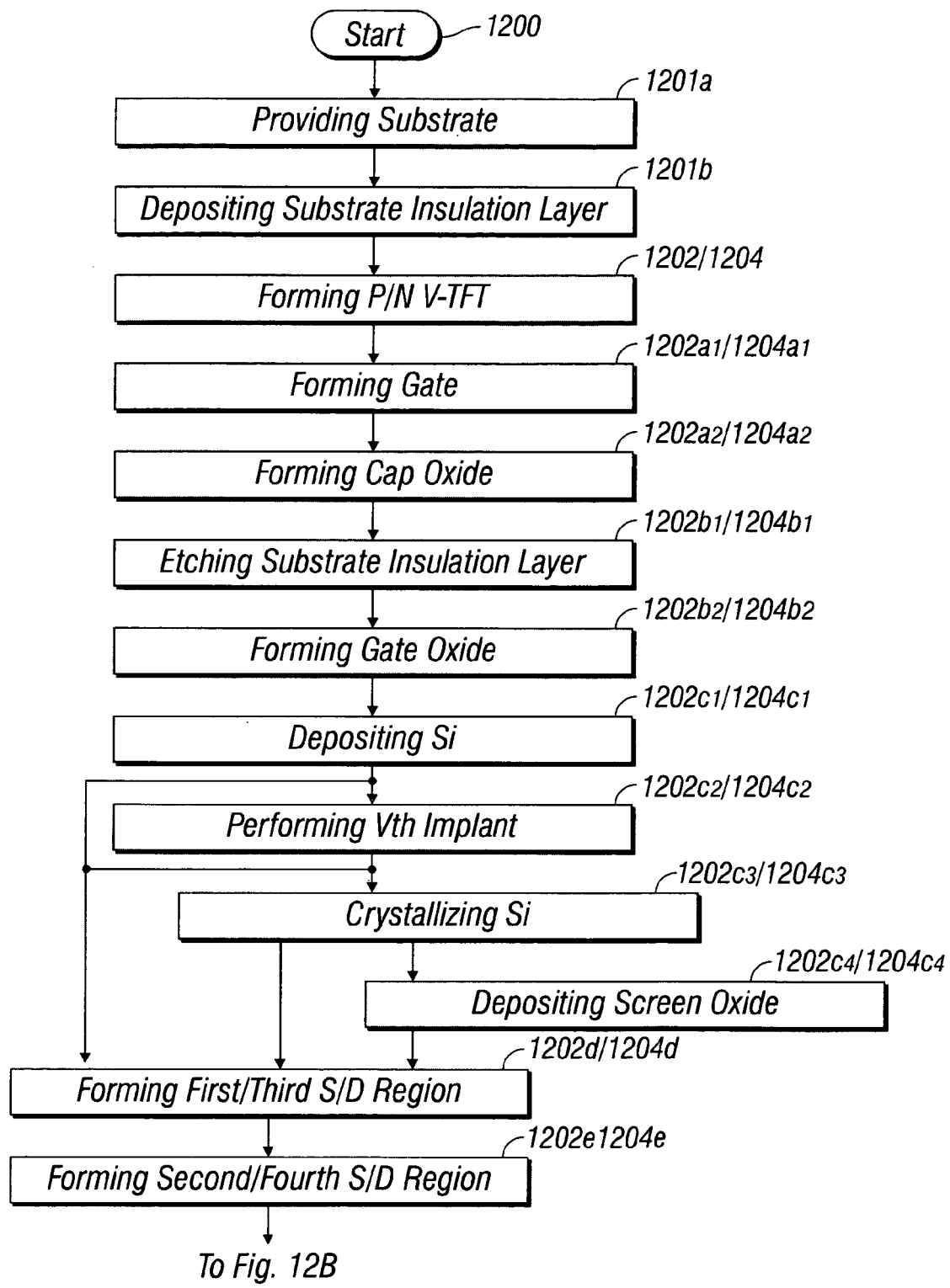
FIGS. 12A and 12B are flowcharts illustrating the present invention method for forming a multi-planar layout TFT inverter circuit.
Figure 12B:
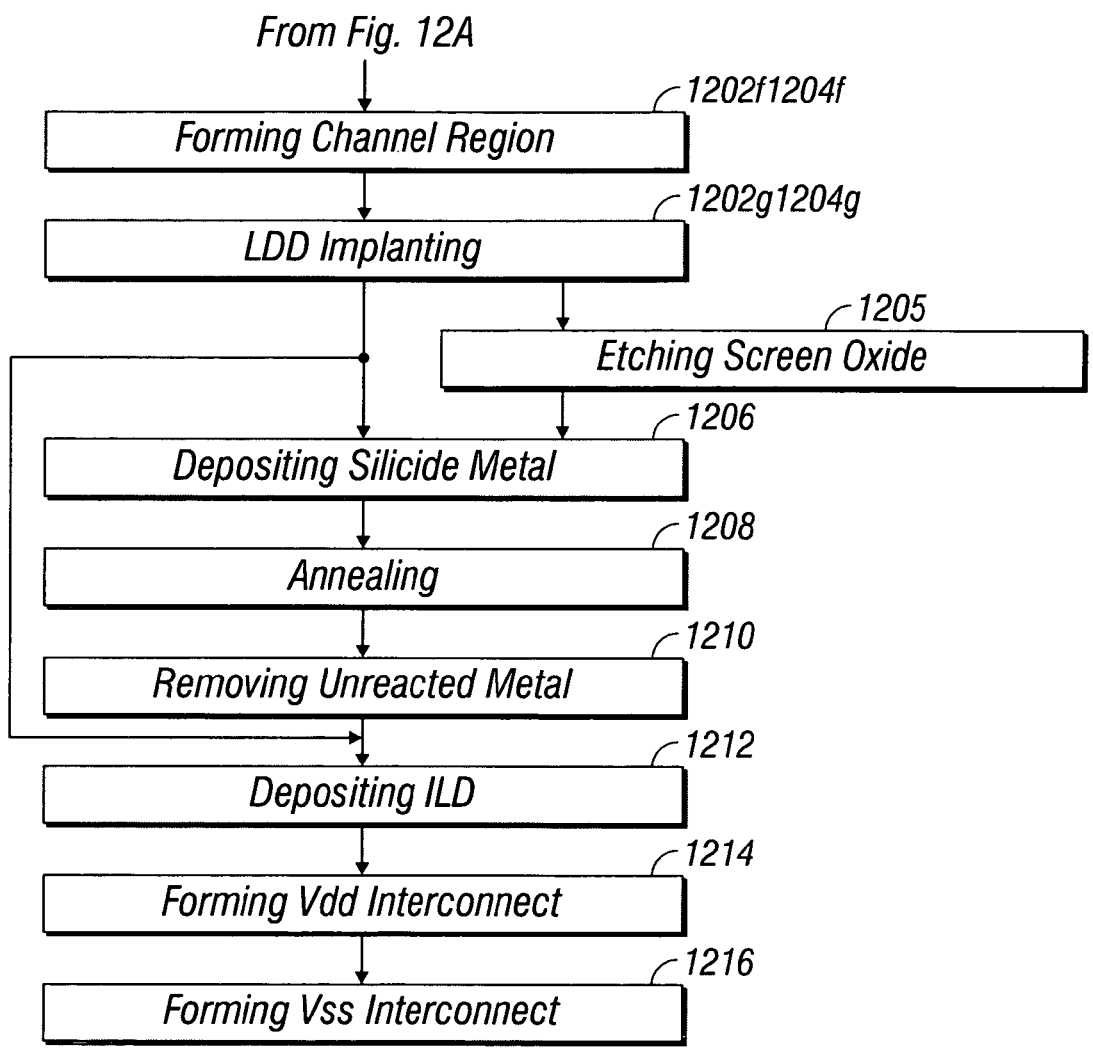

FIGS. 12A and 12B are flowcharts illustrating the present invention method for forming a multi-planar layout TFT inverter circuit. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1200.

Step 1202 forms a P-channel TFT with a gate, a first source/drain (S/D) region in a first horizontal plane, and a second S/D region in a second horizontal plane, different than the first horizontal plane. Step 1204 forms an N-channel TFT, adjacent the P-channel TFT, with a gate, a third S/D region in a third horizontal plane, and a fourth S/D region in the second horizontal plane, different than the third horizontal plane.

In one aspect, Step 1202 forms the P-channel TFT gate with a length, and the width greater than the length. Likewise, Step 1204 forms the N-channel TFT gate with a length, and the width greater than the length. In a different aspect it can be said that the channel lengths are formed in a vertical plane, with respect to the above-mentioned horizontal planes. In another aspect, Steps 1202 and 1204 include forming a S/D region common to both the P-channel and N-channel TFTs. In a different aspect, Step 1202 forms a P-channel top-drain vertical TFT (TDV-TFT) and, Step 1204 forms an N-channel TDV-TFT.

More specifically, Step 1202 and 1204 include substeps. In the interest of simplicity, Steps 1202 and 1204, and their various substeps have been combined since many (but not all) of the parallel substeps are performed simultaneously. Step 1202a1 forms a P-channel gate connected to a gate contact, having sidewalls and a top surface, overlying a substrate insulation layer. Step 1202a2 forms a cap oxide layer overlying the P-channel gate top surface. Step 1202b2 forms a gate oxide layer overlying the P-channel gate sidewalls. Step 1202d forms the first S/D region overlying the P-channel cap oxide layer. Step 1202e forms the second S/D region overlying the substrate insulation layer, adjacent a P-channel gate first sidewall. Step 1202f forms a first channel region overlying the P-channel gate first sidewall, interposed between the first and second S/D regions.

Step 1204a1 forms an N-channel gate connected to the gate contact, having sidewalls and a top surface, overlying the substrate insulation layer. Step 1204a2 forms a cap oxide layer overlying the N-channel gate top surface. Step 1204b2 forms a gate oxide layer overlying the N-channel gate sidewalls. Step 1204d forms the third S/D region overlying the N-channel cap oxide layer. Step 1204e forms the fourth S/D region overlying the substrate insulation layer, adjacent an N-channel gate first sidewall, and connected to the second S/D region. Step 1204f forms a second channel region overlying the N-channel gate first sidewall, interposed between the third and fourth S/D regions.

In one aspect, forming a P-channel gate in Step 1202a1 includes forming a gate with a first thickness, and forming an N-channel gate in Step 1204a1 includes forming a gate with a second thickness. Then, forming first and second channel regions in Step 1202f and 1204f, respectively, includes forming first and second channel regions with channel lengths about equal to the first and second thicknesses, respectively.

One aspect the method further comprises Steps 1202c1 and 1204c1, following the formation of the cap oxide layer (Steps 1202a2 and 1204a2), of conformally depositing a silicon layer. The amorphous Si layer may have a thickness in the range of 300 to 1000 Å. Steps 1202c2 and 1204c2 perform a Vt adjust implant in the first and second channel regions, respectively, and Steps 1202c3/1204c3 crystallize the amorphous Si layer. In one aspect, crystallizing the amorphous Si in Steps 1202c3/1204c3 includes irradiating by excimer laser. Alternately, Steps 1202c3/1204c3 crystallize the amorphous Si layer by: depositing Ni overlying the amorphous Si layer; and, annealing (by whatever means).

In a different aspect, Step 1202c3/1204c3 deposits an absorption oxide layer overlying the amorphous Si layer, having a thickness in the range of 1000 Å to 1.5 microns; and, excimer and $CO_2$ laser irradiating the absorption oxide layer, to heat the underlying amorphous Si. Then, forming the first S/D region (Step 1202d), second S/D region (Step 1202e), third S/D region (Step 1204d), fourth S/D region (Step 1202e), first channel region (Step 1202f), and second channel region (Step 1204f) includes forming the regions from the conformally deposited Si layer.

In a different aspect, Step 1201*a* provides a substrate made from a material such as Si, quartz, glass, or plastic. Step 1201*b* conformally deposits a substrate insulation layer overlying the substrate, made from a material such as SiO2, SiO2/Si3N4/SiO2, or organic insulators such as polyimide. Then, Steps 1202*b*1 and 1204*b*1, following the formation of the P and N-channel gates in Steps 1202*a*1 and 1204*a*1, respectively, etches the exposed substrate insulation layer.

More specifically, forming P and N-channel gates in Step 1202*a*1 and 1204*a*1, respectively, includes forming the gates on a substrate insulation layer having a surface along a fourth (horizontal) plane. Steps 1202*b*1 and 1204*b*1 etch the exposed substrate insulation layer, forming a recess in the substrate insulation layer, lower than the fourth plane. Then, forming first and second channel regions overlying the P and N-channel gate first sidewalls in Step 1202*f* and 1204*f*, respectively, includes extending the channel regions into the substrate insulation layer recess.

In one aspect, forming a P-channel gate overlying the substrate insulation layer in Step 1202*a*1 includes: depositing a Si layer with a first thickness, and sidewalls, overlying the insulating layer; and, P+ doping the first thickness of Si to form the P-channel gate. Likewise, forming a N-channel gate overlying the substrate insulation layer in Step 1204*a*1 includes: depositing a Si layer with a second thickness, and sidewalls, overlying the insulating layer; and, N+ doping the second thickness of Si to form the N-channel gate. For example, the first and second thicknesses may be in the range of 1000 to 6000 Å.

In another aspect, forming a cap oxide layer overlying the P and N-channel gate top surfaces in Steps 1202*a*2 and 1204*a*2, respectively, includes forming a cap oxide layer from a material such as SiO2 or Si3N4, having a thickness in the range of 300 to 1500 Å. Forming a gate oxide layer overlying the P and N-channel gate sidewalls in Steps 1202*a*2 and 1204*a*2, respectively, includes plasma oxidizing the gate Si layer sidewalls.

In another aspect, Steps 1202*g* and 1204*g* form lightly doped drains (LDDs) in the first and second channel regions, respectively, adjacent the first and third S/D regions, respectively. For example, Steps 1202*c*4 and 1204*c*4 deposit a screen oxide layer overlying the amorphous Si layer, having a thickness in the range of 300 to 1000 Å. Then, forming first (Step 1202*d*), second (Step 1202*e*), third (Step 1204*d*), and fourth (Step 1204*e*) S/D regions includes performing source/ drain implants through the screen oxide layer. Likewise, performing an LDD implant in the first and second channel regions (Steps 1202*g* and 1204*g*, respectively) includes performing the LDD implants through the screen oxide layer.

In another aspect, Step 1205 anisotropically etches the screen oxide layer to form spacers. Step 1206 deposits a silicide metal such as Ni, Ti, or Co, overlying the first, second, third, and fourth S/D regions. Step 1208 anneals to form a metal silicide. Step 1210 removes the unreacted metal. Step 1212 deposits an interlevel dielectric (ILD) overlying the P and N-channel TDV-TFTs. Step 1214 forms a Vdd interconnect through the ILD to the first S/D region. Step 1216 forms a Vss interconnect through the ILD to the third S/D region.

A V-TFT inverter circuit and associated fabrication method have been provided. Various process specifics have been described to clarify the invention. However, the invention is not limited to just these examples. Likewise, an inverter circuit has been described. However, the invention has application to a broader range of logical circuits, such as AND and NOR gates for example, and other electrical circuit devices. Other variations and embodiments of the invention will occur to those skilled in the art.

We claim:

1. A method for forming a multi-planar layout thin-film transistor (TFT) inverter circuit, the method comprising:
    forming a P-channel top drain vertical (TDV)-TFT with a gate having a length, and a width greater than the length, a first source/drain (S/D) region in a first horizontal plane, and a second S/D) region in a second horizontal plane, different than the first horizontal plane, as viewed in a vertical cross-section;
    forming an N-channel TDV-TFT, adjacent the P-channel TFT, with a gate having a length, and a width greater than the length, a third S/D region in a third horizontal plane, and a fourth S/D region in the second horizontal plane, different than the third plane
    wherein forming P and N-channel TDV-TFTs includes:
        forming a P-channel rate connected to a gate contact, having sidewalls and a ton surface, overlying a substrate insulation layer;
        forming an N-channel gate connected to the gate contact, having sidewalls and a top surface, overlying the substrate insulation layer;
        forming a cap oxide layer overlying the P and N-channel gate top surfaces;
        forming a gate oxide layer overlying the P and N-channel gate sidewalls;
        forming the first S/D region overlying the P-channel cap oxide layer;
        forming the second S/D region overlying the substrate insulation layer, adjacent a P-channel gate first sidewall;
        forming a first channel region overlying the P-channel gate first sidewall, interposed between the first and second S/D regions;
        forming the third S/D region overlying the N-channel cap oxide layer;
        forming the fourth S/D region overlying the substrate insulation layer, adjacent an N-channel gate first sidewall, and connected to the second S/D region;
        forming a second channel region overlying the N-channel gate first sidewall, interposed between the third and fourth S/D regions; and,
    wherein the N-channel and P-channel and P-channel TDV-TFTs share the second and fourth S/D region.

2. The method of claim 1 wherein forming a P-channel gate includes forming a gate with a first thickness;
    wherein forming an N-channel gate includes forming a gate with a second thickness; and,
    wherein forming first and second channel regions includes forming first and second channel regions with channel lengths about equal to the first and second thicknesses, respectively.

3. The method of claim 1 further comprising:
    following the formation of the cap oxide layer, conformally depositing a silicon (Si) layer; and,
    wherein forming the first S/D region, second S/D region, third S/D region, fourth S/D region, first channel region, and second channel region includes forming the regions from the conformally deposited Si layer.

4. The method of claim 3 further comprising:
    forming a lightly doped drain (LDD) in the first and second channel regions adjacent the first and third S/D) regions, respectively.

5. The method of claim 3 further comprising:
    providing a substrate made from a material selected from group including Si, quartz, glass, and plastic;

conformally depositing a substrate insulation layer overlying the substrate, made from a material selected from the group including SiO2, SiO2/Si3N4/SiO2, and organic insulators such as polyimide; and,
following the formation of the P and N-channel gates, etching the exposed substrate insulation layer.

6. The method of claim 5 wherein forming P and N-channel gates includes forming the gates on a substrate insulation layer having a surface along a fourth plane;
wherein etching the exposed substrate insulation layer includes forming a recess in the substrate insulation layer, lower than the fourth plane; and,
wherein forming first and second channel regions overlying the P and N-channel gate first sidewalls includes extending the channel regions into the substrate insulation layer recess.

7. The method of claim 5 wherein forming P and N-channel gates overlying the substrate insulation layer includes:
depositing a Si layer with first and second thicknesses, and sidewalls, overlying the insulating layer;
P+ doping the first thickness of Si to form the P-channel gate; and,
N+ doping the second thickness of Si to form the N-channel gate.

8. The method of claim 2 wherein forming P and N-channel gates with a first and second thicknesses includes the thicknesses being in the range of 1000 to 6000 Å.

9. The method of claim 7 wherein forming a gate oxide layer overlying the P and N-channel gate sidewalk includes plasma oxidizing the gate Si layer sidewalls; and,
wherein forming a cap oxide layer overlying the P and N-channel gate top surfaces includes forming a cap oxide layer from a material selected from the group including SiO2 and Si3N4, having a thickness in the range of 300 to 1500 Å.

10. The method of claim 5 wherein conformally depositing a Si layer overlying the cap oxide layer includes depositing an amorphous Si layer having a thickness in the range of 300 to 1000 Å;
the method further comprising:
performing a Vt adjust implant in the first and second channel regions; and,
crystallizing the amorphous Si layer.

11. The method of claim 1 further comprising:
depositing a silicide metal selected from the group including Ni, Ti, and Co, overlying the first, second, third, and fourth S/D regions;
annealing to form a metal silicide; and,
removing the unreacted metal.

12. The method of claim 10 further comprising:
depositing an absorption oxide layer overlying the amorphous Si layer, having a thickness in the range of 1000 Å to 1.5 microns; and
wherein crystallizing the amorphous Si layer includes excimer and CO2 laser irradiating the absorption oxide layer, to heat the underlying amorphous Si.

13. The method of claim 10 further comprising:
depositing a screen oxide layer overlying the amorphous Si layer, having a thickness in the range of 300 to 1000 Å;
wherein forming first, second, third, and fourth S/D regions includes performing source/drain implants through the screen oxide layer; and,
the method further comprising:
performing an LDD implant in the first and second channel regions through the screen oxide layer.

14. The method of claim 13 further comprising:
anisotropically etching the screen oxide layer to form spacers.

15. The method of claim 1 further comprising:
depositing an interlevel dielectric (ILD) overlying the P and N-channel TDV-TFTs;
forming a Vdd interconnect through the ILD to the first S/D region; and,
forming a Vss interconnect through the ILD to the third S/D region.

16. A method for forming a top-drain vertical thin film transistor (TDV-TFT inverter circuit, the method comprising:
forming a P-channel TDV-TFT as follows:
forming a P-channel gate connected to a gate contact, having sidewalls and a top surface, overlying a substrate insulation layer;
forming a cap oxide layer overlying the P-channel gate top surface;
forming a gate oxide layer overlying the P-channel gate sidewalls;
forming a first S/D region overlying the P-channel cap oxide layer;
forming a second S/D region overlying the substrate insulation layer, adjacent a P-channel gate first sidewall;
forming a first channel region overlying the P-channel gate first sidewall, interposed between the first and second S/D regions;
forming an N-channel TDV-TFT as follows:
forming an N-channel gate connected to the gate contact, having sidewalls and a top surface, overlying the substrate insulation layer;
forming a cap oxide layer overlying the N-channel gate top surface;
forming a third S/D region overlying the N-channel cap oxide layer;
forming a fourth S/D region overlying the substrate insulation layer, adjacent an N-channel gate first sidewall, and connected to the second S/D region; and,
forming a second channel region overlying the N-channel gate first sidewall, interposed between the third and fourth S/D regions.

* * * * *

UNITED STATES PATENT AND TRADEMARK OFFICE
CERTIFICATE OF CORRECTION

PATENT NO. : 7,235,437 B2
APPLICATION NO. : 10/862761
DATED : June 26, 2007
INVENTOR(S) : Schuele et al.

It is certified that error appears in the above-identified patent and that said Letters Patent is hereby corrected as shown below:

In col. 8, line 18, of claim 1, the word "gate" has been incorrectly printed as the word "rate". Claim 1 should read as follows:

--1. A method for forming a multi-planar layout thin-film transistor (TFT) inverter circuit, the method comprising:
forming a P-channel top drain vertical (TDV)-TFT with a gate having a length, and a width greater than the length, a first source/drain (S/D) region in a first horizontal plane, and a second S/D region in a second horizontal plane, different than the first horizontal plane, as viewed in a vertical cross-section:
forming an N-channel TDV-TFT, adjacent the P-channel TFT, with a gate having a length, and a width greater than the length, a third S/D region in a third horizontal plane, and a fourth S/D region in the second horizontal plane, different than the third plane wherein forming P and N-channel TDV-TFTs includes:
forming a P-channel gate connected to a gate contact, having sidewalls and a top surface, overlying a substrate insulation layer;
forming an N-channel gate connected to the gate contact, having sidewalls and a top surface, overlying the substrate insulation layer;
forming a cap oxide layer overlying the P and N-channel gate top surfaces;
forming a gate oxide layer overlying the P and N-channel gate sidewalls;
forming the first S/D region overlying the P-channel cap oxide layer;
forming the second S/D region overlying the substrate insulation layer, adjacent a P-channel gate first sidewall;
forming a first channel region overlying the P-channel gate first sidewall, interposed between the first and second S/D regions;
forming the third S/D region overlying the N-channel cap oxide layer;
forming the fourth S/D region overlying the substrate insulation layer, adjacent an N-channel gate first sidewall, and connected to the second S/D region;
forming a second channel region overlying the N-channel gate first sidewall, interposed between the third and fourth S/D regions; and,

UNITED STATES PATENT AND TRADEMARK OFFICE
CERTIFICATE OF CORRECTION

PATENT NO. : 7,235,437 B2
APPLICATION NO. : 10/862761
DATED : June 26, 2007
INVENTOR(S) : Schuele et al.

It is certified that error appears in the above-identified patent and that said Letters Patent is hereby corrected as shown below:

Claim 1 should read as follows: (cont'd)

wherein the N-channel and P-channel TDV-TFTs share the second and fourth S/D region.--

Signed and Sealed this

Eleventh Day of September, 2007

JON W. DUDAS
*Director of the United States Patent and Trademark Office*